United States Patent
Minamihaba et al.

(10) Patent No.: US 7,833,431 B2
(45) Date of Patent: Nov. 16, 2010

(54) AQUEOUS DISPERSION FOR CMP, POLISHING METHOD AND METHOD FOR MANUFACTURING SEMICONDUCTOR DEVICE

(75) Inventors: Gaku Minamihaba, Yokohama (JP);
Nobuyuki Kurashima, Yokohama (JP);
Dai Fukushima, Kamakura (JP);
Yukiteru Matsui, Yokohama (JP);
Susumu Yamamoto, Oita (JP);
Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 984 days.

(21) Appl. No.: 11/561,071

(22) Filed: Nov. 17, 2006

(65) Prior Publication Data
US 2007/0128873 A1    Jun. 7, 2007

(30) Foreign Application Priority Data
Dec. 1, 2005   (JP)   ............... 2005-348154

(51) Int. Cl.
*B44C 1/22*   (2006.01)
*H01L 21/302*  (2006.01)
*C09K 13/00*   (2006.01)
*C03C 15/00*   (2006.01)

(52) U.S. Cl. .................. 216/89; 216/88; 438/692; 252/79.1

(58) Field of Classification Search .............. 216/88, 216/89; 438/692; 252/79.1
See application file for complete search history.

(56) References Cited

U.S. PATENT DOCUMENTS

| | | | |
|---|---|---|---|
| 6,454,819 B1 | 9/2002 | Yano et al. | |
| 6,858,539 B2 | 2/2005 | Minamihaba et al. | |
| 7,396,768 B2 * | 7/2008 | Feng et al. | 438/692 |
| 2002/0068455 A1 * | 6/2002 | Tsai et al. | 438/692 |
| 2007/0111517 A1 * | 5/2007 | Neo et al. | 438/626 |

FOREIGN PATENT DOCUMENTS

| | | | |
|---|---|---|---|
| JP | 10-270400 | | 10/1998 |
| JP | 2002-69434 | | 3/2002 |
| JP | 2004-143429 | * | 5/2004 |
| JP | 2005-93785 | | 4/2005 |

* cited by examiner

*Primary Examiner*—Shamim Ahmed
(74) *Attorney, Agent, or Firm*—Oblon, Spivak, McClelland, Maier & Neustadt, L.L.P.

(57) ABSTRACT

An aqueous dispersion for chemical mechanical polishing is provided, which includes water and a resin particle. The resin particles accompany with a projection having a curvature radius ranging from 10 nm to 1.65 μm on a surface. The maximum length of the resin particles is not more than 5 μm and is 2.5 to 25 times as large as the curvature radius.

20 Claims, 5 Drawing Sheets

AQUEOUS DISPERSION FOR CMP, POLISHING METHOD AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2005-348154, filed Dec. 1, 2005, the entire contents of which are incorporated herein by reference.

BACKGROUND OF THE INVENTION

1. Field of the Invention

This invention relates to an aqueous dispersion for chemical mechanical polishing (CMP), to a polishing method and to a method for manufacturing a semiconductor device.

2. Description of the Related Art

In recent years, in concomitant with a trend to further increase the integration density of LSI, the wirings thereof are increasingly refined with the employment of Low-k insulating film and a high-conductivity material such as Cu. In the process of manufacturing semiconductor, steps such, in particular, a step for CMP such as a damascene wiring-forming step, a planarizing step and a washing step are considered key in promoting the refinement of the wirings.

In this CMP, it is required to perform the polishing with minimum damage to a polishing surface in order to prevent the peeling of film and the fracture of pattern, and hence it has been proposed to employ, as a slurry, an aqueous dispersion for CMP where resin particles are employed. There has been also proposed a slurry comprising an abrasive comprising inorganic particles having resin particles adsorbed on the surface thereof. In spite of these proposals, there is still an increasing demand to further enhance the polishing performance and the suppression of dishing. However, there is no technique known at present to sufficiently meet such a demand.

BRIEF SUMMARY OF THE INVENTION

An aqueous dispersion for chemical mechanical polishing according to one aspect of the present invention comprises water; and a resin particle accompanying, on a surface thereof, with a projection having a curvature radius ranging from 10 nm to 1.65 μm, a maximum length of the resin particle being not more than 5 μm and being 2.5 to 25 times as large as the curvature radius.

A polishing method according to another aspect of the present invention comprises contacting a semiconductor substrate having a treating film with a polishing pad attached to a turntable; and feeding an aqueous dispersion for CMP to the polishing pad to polish a surface of the treating film, the aqueous dispersion for CMP comprising water and a resin particle, the resin particle accompanying with a projection having a curvature radius ranging from 10 nm to 1.65 μm on a surface thereof, a maximum length of the resin particle being not more than 5 μm and being 2.5 to 25 times as large as the curvature radius.

A method for manufacturing a semiconductor device according to another aspect of the present invention comprises forming an insulating film above a semiconductor substrate; forming a recess in the insulating film; depositing a metal in the recess and above the insulating film to form a metal film; and removing at least a part of the metal film deposited above the insulating film by an aqueous dispersion for CMP, the aqueous dispersion for CMP comprising water; a resin particle; an oxidizing agent for the metal; a complexing agent for forming an organometal complex; and an inorganic particle; the resin particle accompanying with a projection having a curvature radius ranging from 10 nm to 1.65 μm on a surface thereof, a maximum length of the resin particle being not more than 5 μm and being 2.5 to 25 times as large as the curvature radius.

DETAILED DESCRIPTION OF THE INVENTION

Next, embodiments of the present invention will be explained as follows.

The aqueous dispersion for CMP according to embodiments of the present invention comprises associated resin particle (hereinafter, it may be referred to simply as resin particle) which meet various prescribed conditions. The associated resin particle herein is constituted by a plurality of primary particles having a curvature radius ranging from 10 nm to 1.65 μm. Therefore, it can be said that the surface of this associated resin particle is provided with a projection having a curvature radius ranging from 10 nm to 1.65 μm. The curvature radius of the projection can be measured by an SEM or TEM photograph. A particle having a curvature radius of less than 10 nm would be difficult to manufacture. Even if it is succeeded to manufacture such a small particle, it would be impossible to obtain an actually useful abrasive force with the employment of such a particle. On the other hand, when a particle having a curvature radius of more than 1.65 μm is employed, it would be impossible to suppress the generation of dishing.

Further, the resin particle is required to have a maximum length which is not more than 5 μm and is 2.5 to 25 times as large as the curvature radius. Both of the maximum length and curvature radius of the resin particle can be measured by an SEM or TEM photograph. The resin particle that can be employed in the embodiment of the present invention is formed of a composite particle wherein a group of particles each having a predetermined diameter are integrated with each other. When the maximum length of resin particle is twice as large as the curvature radius thereof, the resin particle is formed of a single spherical particle which is not associated. Even if the maximum length of resin particle is less than 2.5 times as large as the curvature radius thereof, the resin particle may be said as being substantially spherical. Therefore, when the maximum length of resin particle is less than 2.5 times as large as the curvature radius thereof, it would be impossible to derive the effects of association from such a resin particle. Namely, it is only possible to obtain almost the same degree of effects as obtainable from the conventional spherical particle. When the maximum length of resin particle is more than 25 times as large as the curvature radius thereof, the effects of the projection on the surface of resin particle would be reduced, resulting in the deterioration of the effects of the association, thus making it only possible to obtain almost the same degree of effects as obtainable from the conventional single (not associated) particle. When the maximum length of resin particle is larger than 5 µm, it would be impossible to suppress the generation of dishing and therefore, the upper limit of the maximum length of resin particle should be set to 5 µm.

Figure 1A:
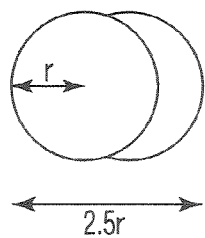
FIGS. 1A and 1B show respectively a schematic view of one example of a resin particle to be employed in an aqueous dispersion for CMP according to one embodiment of the present invention.
Figure 1B:
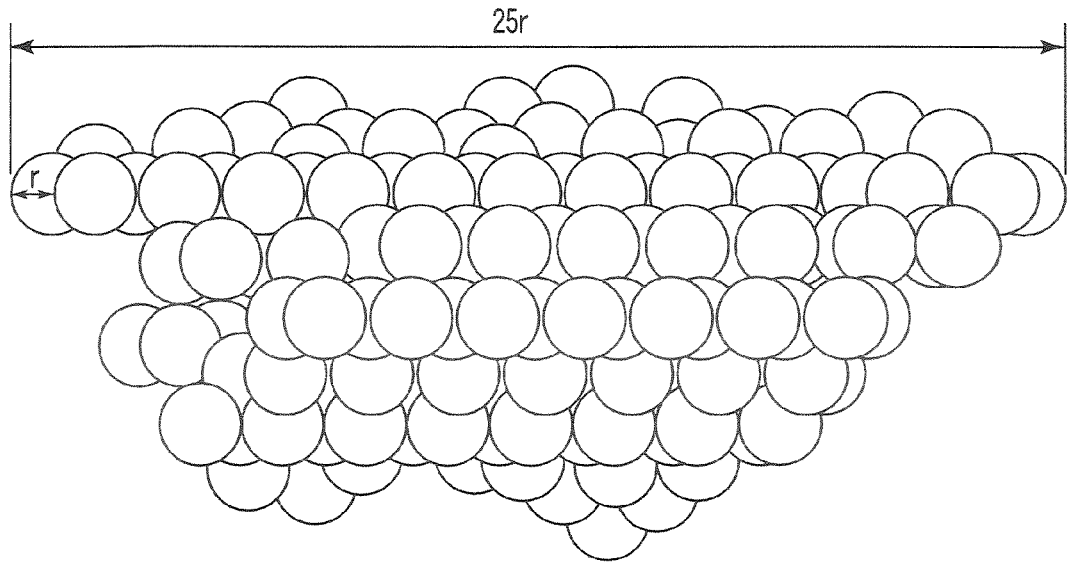

FIGS. 1A and 1B show schematic views of examples of the resin particle. In all of the resin particles shown in FIGS. 1A and 1B, the curvature radius of the projection on the surface of resin particle is "r". The maximum length of resin particle shown in FIG. 1A is 2.5 times as large as the curvature radius thereof, and the maximum length of resin particle shown in FIG. 1B is 25 times as large as the curvature radius thereof.

As long as the relationship between the curvature radius and the maximum length of the projection is satisfied as described above, there is not any particular limitation with respect to the configuration of the resin particle. Namely, the resin particle may not be spherical but may be of any configuration as shown in FIG. 1B.

Figure 2:
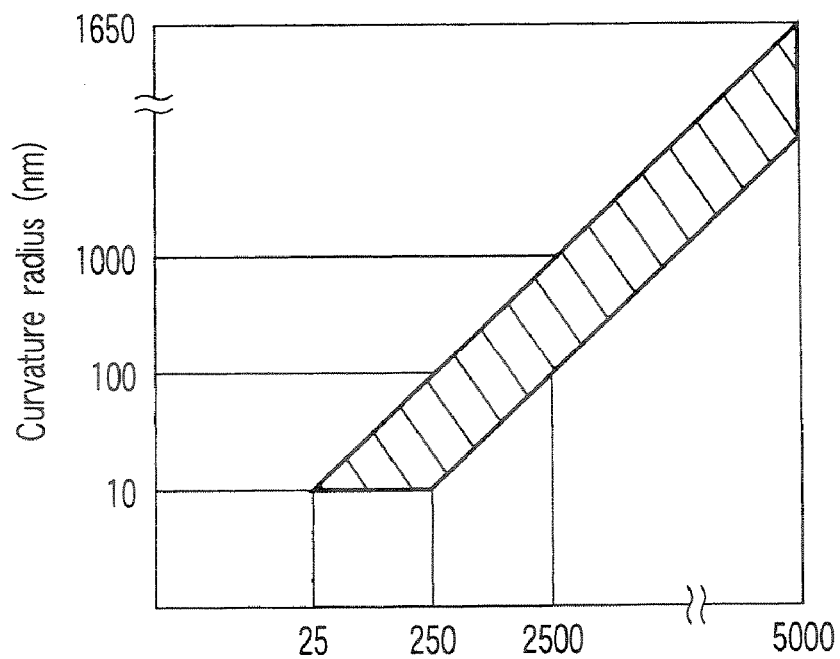
FIG. 2 shows a graph illustrating the relationship between the maximum length and the curvature radius of a resin particle to be employed in an aqueous dispersion for CMP according to one embodiment of the present invention.

The graph of FIG. 2 shows the above-mentioned relationship between the curvature radius and the maximum length of the resin particle. The resin particle to be employed in the aqueous dispersion for CMP according to one embodiment of the present invention Is confined so as to fall within the shaded region in the graph of FIG. 2.

The resin particle satisfying the above-mentioned relationship between the curvature radius and the maximum length is an associated particle which is quite different from the conventional single (not associated) spherical particle. The state of association of the associated resin particle can be confirmed by a TEM photograph. Due to this association, it is now possible to suppress the generation of dishing in addition to the achievement of high abrasive force, which conventional spherical particle (not associated) has so far failed to achieve.

Moreover, due to the association of primary particles, the resin particle according to embodiments of the present invention is provided with a projection on the surface thereof, thus making it possible to suppress the rolling thereof. Meanwhile, the surface of polishing pad is generally accompanied with fine convex/concave portions about 1 to 5 µm in height, so that the resin particle having a maximum length of 5 µm or so is enabled to be entrapped in a concavity of the convex/concave portion on the surface of polishing pad. As a result, the resin particle thus entrapped is suppressed from rolling and hence is seemingly brought into a fixed state on the polishing pad, thus contributing to the increase of polishing rate and to the suppression of dishing.

The resin particle may be formed of at least one selected from the group consisting of polymethyl methacrylate (PMMA), polystyrene, polyethylene, polyethylene glycol, polyvinyl acetate, polybutadiene, polyisobutylene, polypropylene and polyoxymethylene. In view of excellent stability in the manufacture of the resin particle and the operating experience in the field of semiconductor, PMMA and polystyrene are preferable. The surface of the resin particle should preferably be accompanied with at least one functional group selected from the group consisting of carboxyl group, amino group and sulfonyl group. These functional groups contribute to the retention of a stable dispersed state of the resin particle in a solvent such as pure water, thus enabling the resin particle to exhibit stable polishing performance. A surfactant may be additionally incorporated in the dispersion to enable these functional groups to bond to the surface of resin particle.

The resin particles thus dispersed in a solvent such as pure water generally exist stably therein without being flocculated due to the electrostatic repulsive force by the surface charge. When this surface charge is reduced, the attractive force between resin particles will be increased, thus making it possible to manufacture the associated resin particle. For example, an acid such as dilute hydrochloric acid is added as a reverse-neutralizer to the dispersion to cause the resin particles to approach to each other and then the dispersion is heated to a temperature higher than the glass transition temperature of the resin particle. On this occasion, the dispersion is stirred with a propeller while applying a pressure thereto, thus obtaining a desired associated resin particle.

The aqueous dispersion for CMP according to embodiments of the present invention can be prepared by dispersing the aforementioned resin particles in water. As for water, it is possible to employ pure water, ion-exchange water, etc. The content of the resin particles should preferably be confined within the range of 0.05 to 5 wt % based on the aqueous dispersion. When the content of the resin particle is less than 0.05 wt %, it would be difficult to secure a practical polishing rate. On the other hand, when the content of the resin particle exceeds 5 wt %, it would become difficult to suppress the generation of dishing.

The aqueous dispersion for CMP thus prepared can be employed as a slurry for the CMP of an organic film such as resist film.

Alternatively, the aqueous dispersion for CMP according to one embodiment of the present invention can be also employed as a slurry of the CMP of metal film. In this case, an oxidizing agent for metal, a complexing agent for forming an organometal complex and an inorganic particle are generally further incorporated in the aqueous dispersion.

As the oxidizing agent, it is possible to employ at least one selected from the group consisting of ammonium persulfate, potassium persulfate, hydrogen peroxide, ferric nitrate, diammonium cerium nitrate, iron sulfate, ozone and potassium periodate. In view of the oxidizing power, the compatibility thereof with the complex, and the easiness in handling, it is preferable to employ ammonium persulfate, potassium persulfate or hydrogen peroxide. The content of the oxidizing agent should preferably be confined within the range of 0.05 to 5 wt % based on the aqueous dispersion. When the content of the oxidizing agent is less than 0.05 wt %, it would be difficult to secure a sufficient polishing rate. On the other hand, when the content of the oxidizing agent exceeds 5 wt %, the erosion of metal film such as Cu film and the generation of dishing may be promoted. More preferably, the content of the oxidizing agent should preferably be confined within the range of 0.08 to 3 wt % based on the aqueous dispersion.

The complexing agent may be constituted by a first complexing agent for forming a water-insoluble complex and a second complexing agent for forming a water-soluble complex. Incidentally, by the terms "water-insoluble", it is intended to mean that the complex cannot be substantially dissolved in water, so that as long as the wet etching rate is less than 3 nm/min in the presence of an oxidizing agent, such a hardly soluble complex will be included in this definition. On the other hand, by the terms "water-soluble", it is intended to mean that the wet etching rate is 3 nm/min or more. The content of the complexing agent should preferably be confined within the range of 0.001 to 3.0 wt % based on the aqueous dispersion. When the content of the oxidizing agent is less than 0.001 wt %, it would be difficult to suppress the dishing of metal film to 20 nm or less. On the other hand, when the content of the complexing agent exceeds 3.0 wt %, the polishing rate may be degraded. More preferably, the content of the complexing agent should be confined within the range of 0.05 to 2.0 wt % based on the aqueous dispersion.

As the first complexing agent which forms, together with a metal, a complex which is insoluble or hardly soluble in water, it is possible to employ, for example, heterocyclic compounds such as 6-membered heterocyclic compound containing at least one N atom and 5-membered heterocyclic compound containing at least one N atom. More specifically, it is possible to employ quinaldinic acid, quinolinic acid, benzotriazole, benzoimidazole, 7-hydroxy-5-methyl-1,3,4-triazaindolidine, nicotinic acid, picolinic acid, etc.

Among the anionic surfactants, some of them may be used as the first complexing agent which forms a water-insoluble complex. In particular, it is possible to employ alkylbenzene sulfonate, examples of which including, for example, potassium dodecylbenzene sulfonate, ammonium dodecylbenzene sulfonate, etc.

The content of the first complexing agent should preferably be confined within the range of 0.0005 to 2.0 wt % based on a total weight of the aqueous dispersion for CMP. If the content of the first complexing agent is less than 0.0005 wt %, the dishing of the metal film may become larger. On the other hand, if the content of the first complexing agent exceeds 2.0 wt %, it may become difficult to secure a sufficiently high polishing rate. More preferably, the content of the first complexing agent should be confined within the range of 0.0075 to 1.5 wt % based on a total weight of the aqueous dispersion for CMP.

On the other hand, the second complexing agent which forms a water-soluble complex serves as a polish-accelerating agent. Examples of the second complexing agent include amino acid such as glycine, alanine, tryptophan, etc. Further, organic acids exhibiting almost the same effects as those of the above-mentioned materials can be effectively employed. Examples of such organic acids include, for example, formic acid, lactic acid, acetic acid, tartaric acid, fumaric acid, glycolic acid, phthalic acid, maleic acid, oxalic acid, citric acid, malic acid, malonic acid, glutamic acid, etc. Furthermore, it is also possible to employ ammonia, ethylene diamine, and basic salts such as tetramethyl ammonium hydroxide (TMAH).

The content of the second complexing agent should preferably be confined within the range of 0.0005 to 2.0 wt % based on a total weight of the aqueous dispersion for CMP. If the content of the second complexing agent is less than 0.0005 wt %, it may become difficult to polish a metal film at a sufficiently high polishing rate. On the other hand, if the content of the second complexing agent exceeds 2.0 wt %, the dishing or erosion of the metal film may become prominent. More preferably, the content of the second complexing agent should be confined, though it depends on the kind of metal, within the range of 0.0075 to 1.5 wt % based on a total weight of the aqueous dispersion for CMP.

Each of these first and second complexing agents may be employed singly or in a combination of two or more kinds.

As the inorganic particle, it is possible to employ colloidal silica for example. The primary particle diameter of the colloidal silica should preferably be confined within the range of 5 to 50 nm. If the primary particle diameter of the colloidal silica is less than 5 nm, the abrasive force may become irregular and hence it may become difficult to uniformly polish various configurations of pattern. Furthermore, since the dispersion stability of silica is degraded in this case, the employment thereof may become difficult. On the other hand, if the primary particle diameter of the colloidal silica is larger than 50 nm, it may become difficult to confine the surface roughness Ra of the polishing surface to 3 nm or less and at the same time, the dishing and scratches may become more prominent. If the Ra of the polishing surface is confined to 3 nm or less, it would be acceptable and the magnitude of this Ra can be confirmed by atomic force microscopy (AFM).

As the colloidal silica having a primary particle diameter ranging from 5 to 50 nm, it is possible to employ, for example, colloidal silica having a primary particle diameter of 5 nm or more and a degree of association of 5 or less. By the terms "the degree of association", it is intended to indicate a value that can be obtained by dividing the diameter of secondary particle formed of the primary particles aggregated with other by the diameter of the primary particle (i.e., diameter of secondary particle/diameter of the primary particle). Therefore, when the degree of association is 1, it means that it is consisted of only the primary particles which are monodispersed. The diameter of secondary particle can be measured by dynamic light scattering method or laser diffraction method or electron microscopic method. When the degree of association is higher than 5, scratches or erosion may occur on the occasion of polishing using an aqueous dispersion for CMP which contains, as an abrasive grain, colloidal silica exhibiting more than 5 in the degree of association.

A first colloidal silica having a primary particle diameter ranging from 5 to 20 nm may be combined with a second colloidal silica having a primary particle diameter ranging from more than 20 to 50 nm, thereby enabling them to be used as colloidal silica having a primary particle diameter ranging from 5 to 50 nm. In this case, the weight ratio of the first colloidal silica based on a total weight of the first colloidal silica and the second colloidal silica should preferably be confined within the range of 0.6 to 0.9. If the weight ratio of the first colloidal silica is less than 0.6, the characteristics of the resultant colloidal silica in the employment thereof in the CMP would become close to a case where only the second colloidal silica having large grain size is employed in the CMP, so that Ra of the polishing surface may exceed 3 nm, resulting in a finishing which is prominent in roughness. Furthermore, it may become difficult to suppress the dishing to 20 nm or less. On the other hand, if the weight ratio of the first colloidal silica exceeds 0.9, the characteristics of the resultant colloidal silica in the employment thereof in the CMP would become close to a case where only the first colloidal silica having small grain size is employed in the CMP, resulting in the deterioration of abrasive force.

The content of the inorganic particle such as colloidal silica should preferably be confined within the range of 0.05 to 10 wt %, more preferably 0.1 to 5 wt % based on a total weight of the aqueous dispersion for CMP. If the content of the inorganic particle is less than 0.05 wt %, it would be difficult to secure a sufficient abrasive force. If the content of the inorganic particle exceeds 10 wt %, it may become a cause for increasing the generation of scratches and dishing.

The inorganic particle such as colloidal silica may be contained in the aqueous dispersion for CMP in a state of composite particle in which the inorganic particle is integrated with the resin particle.

The aqueous dispersion for CMP according to one embodiment of the present invention may further comprise, as required, a surfactant, such as anionic surfactant, cationic surfactant and nonionic surfactant. As the anionic surfactant, it is possible to employ aliphatic soap, sulfate ester, and phosphate ester, etc. As the cationic surfactant, it is possible to employ aliphatic amine salt, aliphatic ammonium salt, etc. Further, as the nonionic surfactant, it is possible to employ acetylene glycol, ethylene oxide adduct thereof, and acetylene alcohol, etc. Furthermore, it is also possible to employ silicone-based surfactants, polyvinyl alcohol, cyclodextrin, polyvinyl methylether, hydroxyethyl cellulose, etc. These surfactants may be employed singly or as a mixture comprising two or more kinds.

The content of the surfactant should preferably be confined within the range of 0.001 to 0.5 wt %, more preferably 0.05 to 0.3 wt % based on a total weight of the aqueous dispersion for CMP. If the content of the surfactant is less than 0.001 wt %, it may become difficult to suppress the generation of dishing. If the content of the surfactant exceeds 0.5 wt %, it may also become difficult to suppress the generation of dishing.

As for the pH of the aqueous dispersion for CMP according to one embodiment of the present invention, there is not any particular limitation, so that it may be adjusted depending on the application thereof. For example, a pH adjustor such as potassium hydroxide may be incorporated in the dispersion to adjust the alkalinity thereof.

EMBODIMENT 1

This embodiment will be explained with reference to FIG. 3 to FIG. 4.

Figure 3:
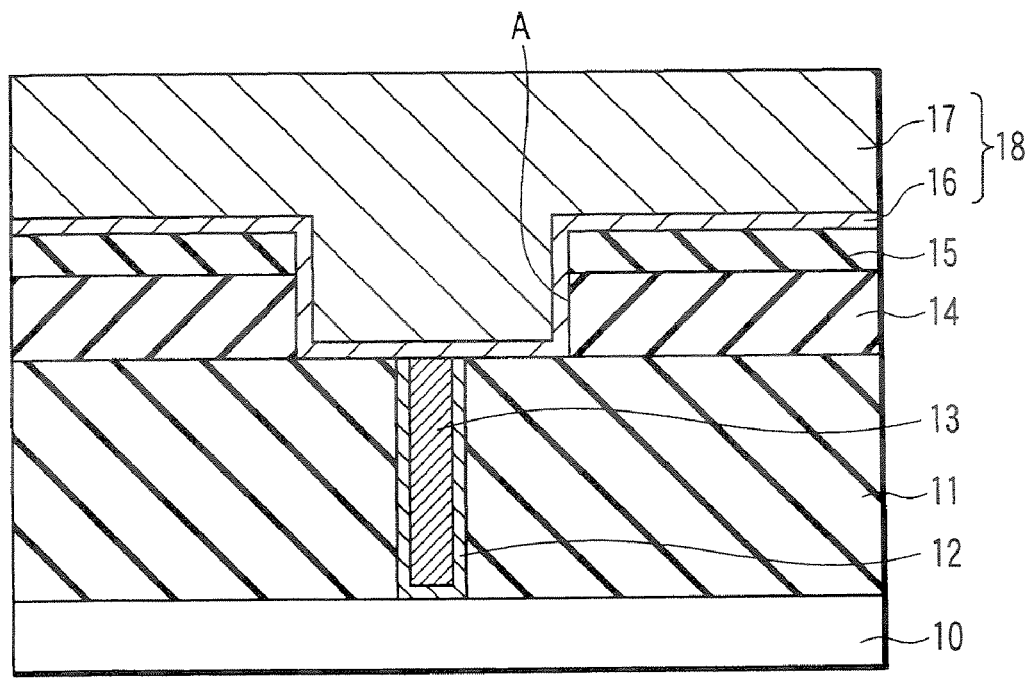
FIG. 3 shows a cross-sectional view illustrating a step in the manufacturing method of a semiconductor device according to one embodiment of the present invention.
Figure 4:
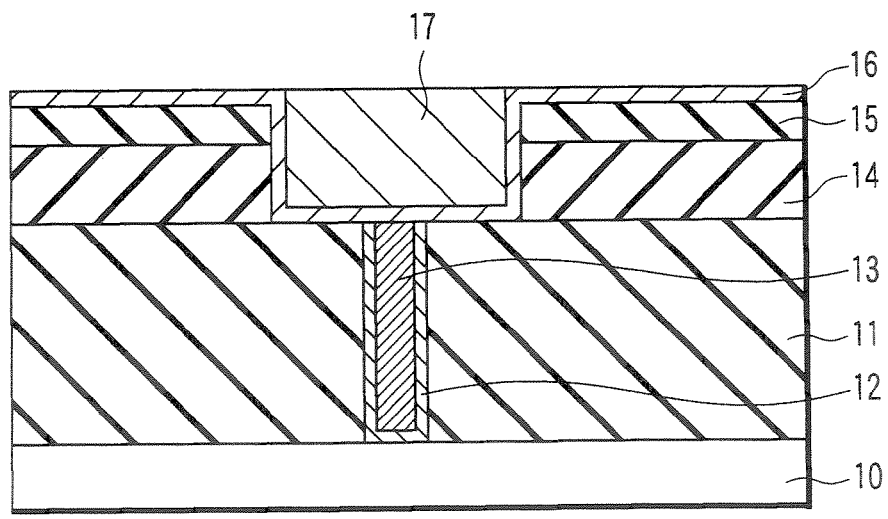
FIG. 4 shows a cross-sectional view illustrating a step next to the step shown in FIG. 3.

First of all, as shown in FIG. 3, an insulating film 11 made of $SiO_2$ was formed on a semiconductor substrate 10 having a semiconductor element (not shown) formed therein and then a plug 13 surrounded by a barrier metal 12 was buried in the insulating film 11. The barrier metal 12 was formed of TiN and the plug 13 was formed of W. Then, a first insulating film 14 and a second insulating film 15 were successively deposited on the insulating film 11, thereby forming a laminated insulating film. In this case, the first insulating film 14 may be formed of an insulating material of low dielectric constant exhibiting a relative dielectric constant of less than 2.5. For example, the first insulating film 14 may be formed by at least one kind of film selected from the group consisting of a film having a siloxane skeleton such as polysiloxane, hydrogen silsesquioxane, polymethyl siloxane, methylsilsesquioxane, etc.; a film containing, as a major component, an organic resin such as polyarylene ether, polybenzoxazole, polybenzocyclobutene, etc.; and a porous film such as a porous silica film. In this embodiment, the first insulating film 14 was formed from LKD (available from JSR).

The second insulating film 15 to be deposited on the first insulating film 14 is enabled to act as a capping insulating film and may be formed by an insulating material having a larger relative dielectric constant than that of the first insulating film 14. For example, the second insulating film 15 may be formed by at least one insulating material having a relative dielectric constant of 2.5 or more, which is selected from the group consisting of $SiO_2$, SiC, SiCH, SiCN, SiOC and SiOCH. In this embodiment, the second insulating film 15 was formed by $SiO_2$.

Then, a wiring trench A was formed as a recess in the second insulating film 15 and the first insulating film 14. Thereafter, a Ta film having a thickness of 5 nm and functioning as a barrier metal 16 and also a Cu film 17 having a thickness of 800 nm were deposited all over the surface. By laminating the Cu film 17 on the barrier metal 16, a metal film 18 is constructed. The wiring trench A was constructed so as to create a fine wiring having a width of 0.06 μm and a wide wiring having a width of 75 μm. The fine wirings were formed at a two different density. One of which is isolated state and the other is 50% of coverage. The wide wirings were formed at a two different density. One of which is isolated state and the other is 95% of coverage. The Cu film 17 constituting the metal film 18 was partially removed by CMP so as to leave the Cu film 17 only in the wiring trench A while partially exposing the surface of the barrier metal 16 as shown in FIG. 4.

Figure 5:
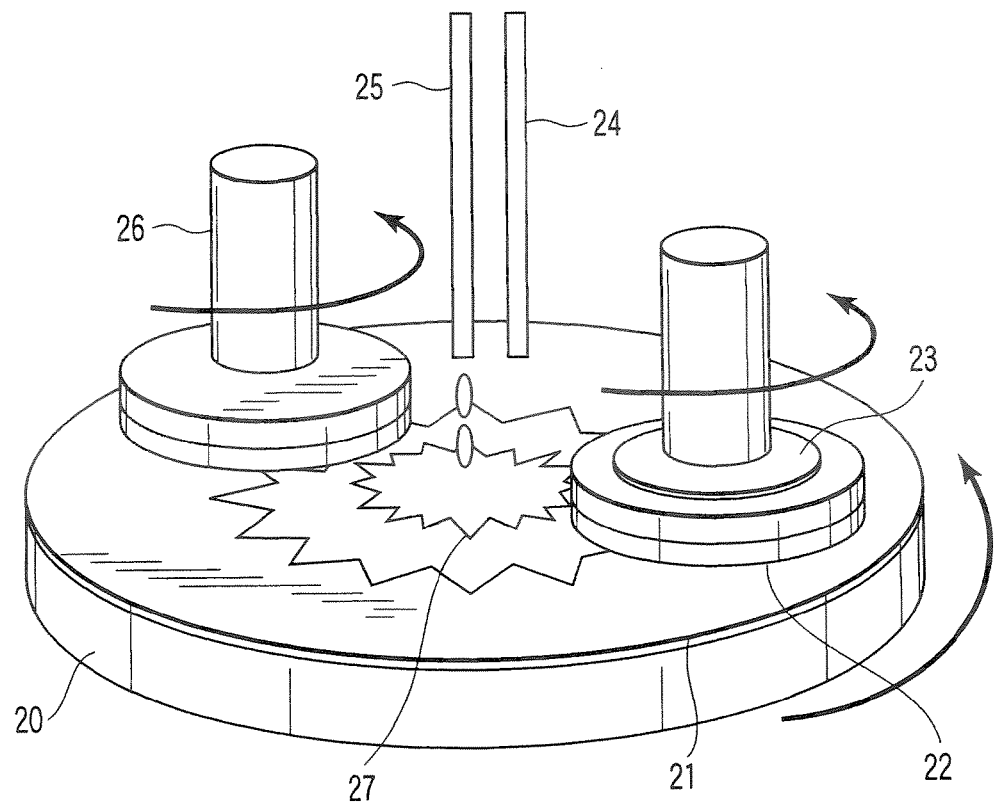
FIG. 5 is a perspective view illustrating the step of CMP.

The CMP of the Cu film 17 was performed as follows. Namely, as shown in FIG. 5, first of all, while a turntable 20 having a polishing pad 21 attached thereon was continued to rotate at a speed of 100 rpm, a top ring 23 holding a semiconductor substrate 22 was contacted with the polishing pad 21 at a polishing load of 200 $g/cm^2$. The rotational speed of the top ring 23 was set to 105 rpm and a slurry 27 was fed from a slurry feed nozzle 25 to the surface of the polishing pad 21 at a flow rate of 200 cc/min.

Incidentally, the polishing load of the top ring 23 may be selected from the range of 10 to 1,000 $g/cm^2$, preferably the range of 30 to 500 $g/cm^2$. Further, the rotational speed of the turntable 20 and the top ring 23 may be selected from the range of 10 to 400 rpm, preferably the range of 30 to 150 rpm. The flow rate of slurry 27 to be fed from the slurry feed nozzle 25 may be selected from the range of 10 to 1,000 cc/min, preferably the range of 50 to 400 cc/min.

As shown below, various aqueous dispersions for CMP were employed as a slurry and, as for the polishing pad 21, IC1000 (RODEL Co., Ltd.) was employed. The polishing was continued to exceed well over the CMP time which enables the barrier metal 16 to expose as a result of the removal of the Cu film 17, thus performing a +50% over-polishing. Incidentally, FIG. 5 also shows a water feed nozzle 24 and a dresser 26.

The preparation of the aqueous dispersion for CMP employed in the polishing of Cu film was performed as follows. First of all, various components were mixed with pure water according to the following recipe to obtain stock solutions. The content of every components represents a content in the aqueous dispersion.

Oxidizing agent: Ammonium persulfate 1.5 wt %
Complexing agent:
Water-insoluble (a first) complexing agent: quinaldinic acid 0.2 wt %; quinolinic acid 0.3 wt %; potassium dodecylbenzene sulfonate 0.05 wt %
Water-soluble (a second) complexing agent: glycine 0.3 wt %; ammonia dissociated from ammonium persulfate
Inorganic particle:
Association degree 2; 0.4 wt % of colloidal silica having a primary particle diameter of 20 nm; and
Association degree 2; 0.1 wt % of colloidal silica having a primary particle diameter of 38 nm
Surfactant: Acetylene diol-based nonion 0.1 wt % Further, the pH of the dispersion was adjusted to 9 by potassium hydroxide.

Only the aforementioned stock solution was employed without the addition of resin particle to obtain an aqueous dispersion of No. 1. Further, the resin particles shown in the following Table 1 were added to an aqueous dispersion at a concentration of 0.3 wt % to prepare aqueous dispersions of No. 2 to No. 7. The curvature radius and maximum length of the projection on the surface of resin particle were measured by a TEM photograph.

TABLE 1

| No. | Curvature radius (nm) | Max. length (nm) | (Max. length/ curvature radius) ratio |
|---|---|---|---|
| 1 | — | — | — |
| 2 | 10 | 20 | 2 |
| 3 | 10 | 25 | 2.5 |
| 4 | 10 | 50 | 5 |
| 5 | 10 | 150 | 15 |
| 6 | 10 | 250 | 25 |
| 7 | 10 | 300 | 30 |

Incidentally, the resin particle employed herein was all polymethacrylate (PMMA) particles having, as a functional group, carboxyl group and sulfonyl group on its surface. The primary particle of PMMA having a curvature radius of 10 nm was prepared. In the case of the aqueous dispersion of No. 2, this primary particle was incorporated as it was without associating the primary particle. The resin particle employed in Nos. 3-7 was formed of associated resin particle which was manufactured by associating the primary particle of the same PMMA so as to obtain a prescribed maximum length. The association was performed as follows. First of all, dilute hydrochloric acid was added to the PMMA and heated to 105° C. On this occasion, the mixture was stirred by propeller while imposing a pressure of about 0.1 MPa, thus obtaining an associated resin particle aimed at.

Using seven aqueous dispersions shown in above Table 1, the CMP of the Cu film 17 was performed under the conditions mentioned above to investigate the abrasive force to Cu, existence/non-existence of peeling of film, and Cu dishing. The abrasive force to Cu was determined by checking the Cu-removing power of the over-plating portion, i.e., the configuration of the step portion.

The polishing was performed as described above. Namely, the polishing was continued to exceed well over the CMP time which enables the barrier metal 16 to expose as a result of the removal of the Cu film 17, thus performing a +50% over-polishing. After finishing the CMP, the step portion on the surface was observed by AFM to measure the step portion of the over-plating portion and the Cu dishing. When the step portion of the over-plating portion was confined within the range of ±10 nm, the abrasive force to Cu was determined as good or "○", and when the step portion of the over-plating portion exceeded this range, the abrasive force to Cu was determined as bad or "X". The peeling of film was determined by visually observing the entire surface of the semiconductor substrate and assessed as follows. When even the peeling was admitted only one portion thereof, it was determined as bad or "x", and when the peeling was not admitted at all, it was determined as good or "○". When the magnitude of dishing was 20 nm or less, it was determined as good or "○", and when the magnitude of dishing was more than 20 nm, it was determined as bad or "x".

The results obtained from each of the aqueous dispersions are summarized in the following Table 2.

TABLE 2

| No. | Cu abrasive force | Peeling of film | Cu dishing |
|---|---|---|---|
| 1 | X | X | ○ |
| 2 | X | X | ○ |
| 3 | ○ | ○ | ○ |
| 4 | ○ | ○ | ○ |
| 5 | ○ | ○ | ○ |
| 6 | ○ | ○ | ○ |
| 7 | ○ | ○ | X |

Since the aqueous dispersion of No. 1 was formulated to contain no resin particle, the step portion of the over-plating portion as well as the peeling of film were assessed as bad. It will be recognized from these results that the incorporation of resin particle is required in order to improve the abrasive force to Cu or the peeling of film.

In the cases of the aqueous dispersions of Nos. 3, 4, 5 and 6, the (maximum length/curvature radius) ratio thereof was all confined within the range of 2.5 to 25. Since the (maximum length/curvature radius) ratio of the resin particle was confined within a predetermined range, the aqueous dispersions of Nos. 3, 4, 5 and 6 were all found excellent with respect to the abrasive force to Cu, the peeling of film and the dishing of Cu.

If this (maximum length/curvature radius) ratio is as small as 2, the resin particle exists as a single particle without association, it is impossible to obtain the effects that can be attained in the associated resin particle. Therefore, as demonstrated by the results of No. 2, the abrasive force to Cu and the peeling of film in such an aqueous dispersion would become unacceptable. On the other hand, if the (maximum length/curvature radius) ratio is as large as 30, the effects of the projection on the surface of resin particle would be reduced and hence the effects of associated particle would be degraded. Therefore, the effects of the resin particle would become equivalent to those of a single spherical resin particle of large size, thereby generating dishing as seen from the results of No. 7.

As for the abrasive force to Cu of the over-plating portion, it can be explained as follows. When a Cu plating is performed on a region of fine pattern where the width of wiring is 0.1 μm or less, the Cu film is formed in a swelled configuration relative to the field portion. In this embodiment, the height of this swelled configuration of the over-plating portion was about 250 nm. When the step portion was measured by AFM after finishing the CMP using the aqueous dispersion of No. 1, a thin film of Cu having a thickness of 10-22 nm was found left behind. Since the Cu thin film remained, the Cu was formed contiguously over the damascene wiring. This residual Cu thin film is required to be removed at the second polishing process (touch-up CMP) to the barrier metal which will be performed in the next step. However, since the depth of wiring is shallow, it is desired to restrict excessive scraping to as minimum as possible in the second polishing process in order to make the depth of every wirings differing in width.

Accordingly, when the conventional aqueous dispersion is employed, it would be impossible to completely remove the residual Cu thin film even in the second polishing. Even if it is succeeded to remove the residual Cu thin film, it would be impossible to control the depth of both of the wirings, i.e., a fine wiring having a width of 0.06 μm and a wide wiring having a width of 75 μm, to a desired depth. Because of this, it is required make the surface of Cu film on a semiconductor substrate as planar as possible at the moment when the first polishing has been finished. When the aqueous dispersions of Nos. 3, 4, 5 and 6 were employed, the step portion generated after the CMP was 0 nm in height, thus indicating ideal finishing. The reason for this can be attributed to the effects of the associated resin particle having a specific curvature radius and a specific (maximum length/curvature radius) ratio.

Since resin particles included in the aqueous dispersions of Nos. 3, 4, 5 and 6 are associated with each other, the rolling of resin particles can be suppressed, thus rendering the resin particle to take seemingly a fixed state on the polishing pad. Because of this, it was assumed possible to suppress the generation of Cu dishing. Whereas, in the case of the conventional resin particle, since the resin particle is spherical, the resin particle rolls during the polishing process, thus resin particle becomes free. As a result, when the particle diameter of resin particle is relatively large as in the case of No. 7, the resin particles enter into the polishing surface, thereby generating the dishing of Cu.

Next, the influence of the concentration of resin particle was investigated. Using the same associated resin particle as that of aforementioned aqueous dispersion of No. 3, the concentration thereof was variously changed as shown in the following Table 3 to prepare the aqueous dispersions of Nos. 8-14. The concentration shown in Table 3 represents a concentration in the aqueous dispersion.

TABLE 3

| No. | Concentration (wt %) |
|---|---|
| 8 | 0.005 |
| 9 | 0.01 |
| 10 | 0.05 |
| 11 | 0.1 |
| 12 | 1 |
| 13 | 5 |
| 14 | 10 |

The CMP of the Cu film 17 was performed under the same conditions as described above except that the aqueous dispersions prepared as described above were employed, thereby investigating the polishing rate, dishing and the existence/non-existence of the peeling of film. The results are summarized in the following Table 4. Incidentally, with respect to the dishing and the peeling of film, they were assessed according to the same criterion as described above. When the polishing rate was 800 nm/min or more, it was determined as good or "◯", and when the polishing rate was less than 800 nm/min, it was determined as bad or "X".

TABLE 4

| No. | Polishing rate | Dishing | Peeling of film |
|---|---|---|---|
| 8 | X | ◯ | X |
| 9 | ◯ | ◯ | X |
| 10 | ◯ | ◯ | ◯ |
| 11 | ◯ | ◯ | ◯ |
| 12 | ◯ | ◯ | ◯ |
| 13 | ◯ | ◯ | ◯ |
| 14 | ◯ | X | ◯ |

As shown in above Table 4, when the resin particle is contained in the aqueous dispersion at a concentration ranging from 0.05 to 5 wt %, it is possible to meet all of the conditions including the polishing rate, dishing and the peeling of film.

If the concentration of the resin particle is less than 0.05 wt %, it would be impossible to enable the resin particle to sufficiently exhibit the effects thereof and hence the polishing rate as well as the peeling of film would become unacceptable. On the other hand, if the resin particle is incorporated exceeding 5 wt %, the dishing generates.

EMBODIMENT 2

Figure 6:
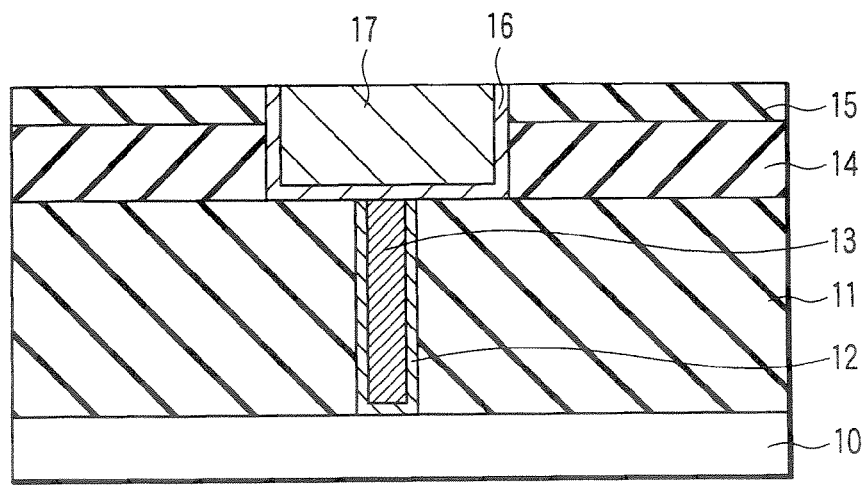
FIG. 6 shows a cross-sectional view illustrating a step next to the step shown in FIG. 4.

This embodiment will be explained with reference to FIGS. 4 and 6. On the occasion of the touch-up CMP wherein the barrier metal 16 is removed so as to expose the surface of the second insulating film 15 as shown in FIG. 6, the second insulating film 15 may be damaged. Therefore, the CMP is desired to be performed under low loadings in order to prevent the peeling of film and to minimize the generation of scratches. However, if the CMP is performed under low loadings, the abrasive force may become insufficient, making it impossible to completely remove the barrier metal 16.

In this embodiment however, an aqueous dispersion for CMP which contained a specific kind of resin particle was employed as a slurry, thereby making it possible to perform the touch-up CMP under low loadings.

The preparation of the aqueous dispersion for CMP employed in the polishing of the barrier metal was performed as follows. First of all, various components were mixed with pure water according to the following recipe to obtain stock solutions. The content of every components represents a concentration in the aqueous dispersion.

Oxidizing agent: Aqueous solution of hydrogen peroxide 0.2 wt %
Complexing agent: Quinolinic acid 0.8 wt %
Inorganic particle:
Association degree 2; 5.5 wt % of colloidal silica having a primary particle diameter of 30 nm
Further, the pH of the dispersion was adjusted to 10.7 by potassium hydroxide.

Only the aforementioned stock solution was employed without the addition of resin particle to obtain an aqueous dispersion of No. 15. Further, the resin particles shown in the following Table 5 were added to an aqueous dispersion at a concentration of 1 wt % to prepare aqueous dispersions of No. 16 to No. 25.

TABLE 5

| No. | Curvature radius (μm) | Max. length (μm) | (Max. length/curvature radius) ratio |
|---|---|---|---|
| 15 | — | — | — |
| 16 | 0.2 | 0.5 | 2.5 |
| 17 | | 5 | 25 |
| 18 | 0.5 | 1.25 | 2.5 |
| 19 | | 5 | 10 |
| 20 | 1.0 | 2.5 | 2.5 |
| 21 | | 5 | 5 |
| 22 | 1.65 | 5 | 3.03 |
| 23 | 2.5 | 5 | 2 |
| 24 | 1.7 | 4.5 | 2.65 |
| 25 | 0.23 | 5.5 | 23.9 |

Incidentally, the resin particle employed herein was all a copolymer particle consisting of cross-linked PMMA and polystyrene having, as a functional group, carboxyl group and sulfonyl group on its surface. Several kinds of primary particles differing in curvature radius were prepared and respectively allowed to associate by the same manufacturing method as employed in Embodiment 1, thereby obtaining associated resin particles each having a predetermined maximum length. The curvature radius of the primary particle of the copolymer employed herein was 0.2, 0.5, 1.0, 1.65, 1.7 and 0.23 μm, respectively. In the case of the aqueous dispersion of No. 23, the copolymer particle having a curvature radium of 2.5 μm was incorporated as it was without associating the copolymer particle. In the case of the aqueous dispersion of No. 24, although the maximum length of the associated resin particle and (maximum length/curvature radius) ratio were found respectively falling within a predetermined range, the curvature radius of the primary particle was found falling outside a predetermined range. Further, in the case of the aqueous dispersion of No. 25, although the curvature radius of the primary particle and (maximum length/curvature radius) ratio were found respectively falling within a predetermined range, the maximum length of the associated resin particle was found falling outside a predetermined range.

The CMP of the barrier metal 16 was performed as follows. Namely, as shown in FIG. 5, first of all, while a turntable 20 having a polishing pad 21 attached thereon was continued to rotate at a speed of 100 rpm, a top ring 23 holding a semiconductor substrate 22 was contacted with the polishing pad 21 at a polishing load of 100 g/cm². Since the polishing load on the occasion of CMP for barrier metal is generally confined within the range of about 300 to 500 gf/cm², the polishing load employed in this embodiment can be said as sufficiently low. The rotational speed of the top ring 23 was set to 103 rpm and a slurry 27 was fed from a slurry feed nozzle 25 to the surface of the polishing pad 21 at a flow rate of 200 cc/min.

Using aforementioned eleven aqueous dispersions, the CMP of the barrier metal 16 was performed under the aforementioned conditions to investigate the polishing rate of Cu and of $SiO_2$. The results obtained are summarized together with the evaluation of dishing in the following Table 6. As explained above, when the magnitude of dishing was 20 nm or less, it was determined as good or "○", and when the magnitude of dishing was more than 20 nm, it was determined as bad or "X".

TABLE 6

| No. | Polishing rate (nm/min) Cu | Polishing rate (nm/min) $SiO_2$ | Dishing |
|---|---|---|---|
| 15 | 18 | 18 | ○ |
| 16 | 38 | 36 | ○ |
| 17 | 42 | 38 | ○ |
| 18 | 39 | 40 | ○ |
| 19 | 44 | 42 | ○ |
| 20 | 41 | 41 | ○ |
| 21 | 38 | 40 | ○ |
| 22 | 40 | 41 | ○ |
| 23 | 23 | 18 | X |
| 24 | 28 | 18 | X |
| 25 | 32 | 17 | X |

As shown in above Table 6, in the case of the aqueous dispersion of No. 15 which contained no resin particle, the polishing rate of the $SiO_2$ was 20 nm/min or less. Even if the resin particle was contained in an aqueous dispersion, the polishing rate would not be enhanced unless the aforementioned predetermined conditions are not satisfied. For example, in the case of the aqueous dispersion of No. 23 where the resin particle which was large in curvature radius and was not associated was contained therein, the polishing rate of the $SiO_2$ was almost the same, i.e., 20 nm/min or less. In the case of the aqueous dispersion of No. 24 where the primary particle having a curvature radius of 1.7 μm was associated, the polishing rate of the $SiO_2$ was also almost the same, i.e., 20 nm/min or less. Moreover, in the case of the aqueous dispersion of No. 24, dishing generated exceeding over an acceptable range. Further, in the case of the aqueous dispersion of No. 25 where associated resin particle having a maximum length of more than 5 μm was employed in the, the polishing rate of the $SiO_2$ was 20 nm/min or less. Additionally, dishing was further increased up to 42 nm.

Whereas, in the cases of the aqueous dispersions of Nos. 16-22 where the curvature radius, (maximum length/curvature radius) ratio and maximum length of associated resin particle were all confined within a predetermined range, the polishing rate of the $SiO_2$ was 36 nm/min or more, indicating an increase of 100% or more as compared with that of the aqueous dispersions of Nos. 15 and 23. The improvement of the polishing rate can be attributed to an increase of true contact of the polishing pad with the treating film of semiconductor substrate, which can be explained as follows.

Since the surface of polishing pad is accompanied with fine convex/concave portions, even if a semiconductor substrate was contacted with the polishing pad, the contacting surface of the semiconductor substrate cannot be entirely contacted with the polishing pad. Namely, so-called true contact wherein the surface of semiconductor substrate is enabled to actually contact with the polishing pad is about 1% of the entire area of the semiconductor substrate. Therefore, it is reported that in order to enhance the polishing rate, it is required to increase the true contact (for example, Digest of Technology of Semiconductor Materials, 2005; separate volume of Electronic Journal, $10^{th}$ Edition, Chapter 1; Slurry and Pad for CMP; Existing Conditions and Trend of Related Materials; Toshiba Semiconductor Co., Ltd.; T. Nishioka, p. 284).

For example, when materials such as resin particle made of the same material as that of polishing pad is entrapped in a concavity of the convex/concave portion on the surface of polishing pad, the resin particle is seemingly brought into a fixed state on the polishing pad. As a result, a portion of the contacting surface of the semiconductor substrate also contacts with the resin particle in addition to a portion of the contacting surface which is actually contacted with the polishing pad. As a result, the true contact can be increased. As the surface area of the resin particle thus entrapped is increased, the effect of increasing the true contact would become more prominent. Since the surface area of the associated resin particle is larger than that of single resin particle which is not associated even if the maximum length of these resin particle is the same with each other, it is possible to increase the true contact by enabling the associated resin particle to interpose between the polishing pad and the semiconductor substrate. It is assumed that, because of this, it was possible, in the cases of the aqueous dispersions of Nos. 16-22 where predetermined preferable resin particles were employed, to realize a high polishing rate even under low polishing load. Whereas, in the case of the aqueous dispersion of Nos. 23, since the resin particle included in the aqueous dispersion is not associated, it was impossible to enhance the polishing rate.

Incidentally, even in the case where resin particle is adsorbed onto the surface of inorganic particle so as to create an associated particle, it is possible to increase the true contact as the surface area can be increased likewise in this case. In this case however, as the polishing is proceeded, the resin particle will be desorbed, thus making it difficult to continuously retain the effects thereof. If the particle diameter of the resin particle thus desorbed is small, it may be entrapped inside the concavity of the surface of polishing pad, thus making it impossible to enable the desorbed resin particle to contact with the contacting surface of the semiconductor substrate. Whereas, in the case of the associated resin particle according to this embodiment of the present invention, since the associated resin particle is prevented from being separated into individual primary particle during the polishing process, it is possible to retain the increased true contact until the polishing is finished.

As described above, it has been confirmed possible, through the employment of an aqueous dispersion which satisfies all of the aforementioned conditions including the curvature radius, (maximum length/curvature radius) ratio and maximum length, to completely remove the barrier metal even with a low polishing load of around 100 gf/cm$^2$.

Incidentally, when the aqueous dispersion of No. 22 was employed, it was possible to completely remove the barrier metal even with a polishing load of 30 gf/cm$^2$. Therefore, the polishing load in the touch-up CMP should preferably be confined within the range of 30 to 100 gf/cm$^2$.

In the foregoing embodiments, Cu was employed as a wiring material, W was employed as a plug material, and Ta was employed as a barrier metal. However, the metals which are expected to be effective in deriving the effects of slurry according to one embodiment of the present invention would not be limited these metals.

The aqueous dispersion for CMP according to this embodiment of the present invention is applicable to Cu, Al, W, Ti, Ta, V, Mo, Ru, Zr, Mn, Ni, Fe, Ag, Mg, Si, a laminate structure comprising any of these elements, and a structure where a barrier metal is not substantially existed therein.

Namely, the aqueous dispersion for CMP according to this embodiment of the present invention is expected to exhibit almost the same effects on the occasion of polishing most of the metals.

EMBODIMENT 3

The aqueous dispersion for CMP according to this embodiment of the present invention is also applicable to the CMP of an organic film such as resist film. This embodiment will be explained with reference to FIGS. 7 to 11.

Figure 7:
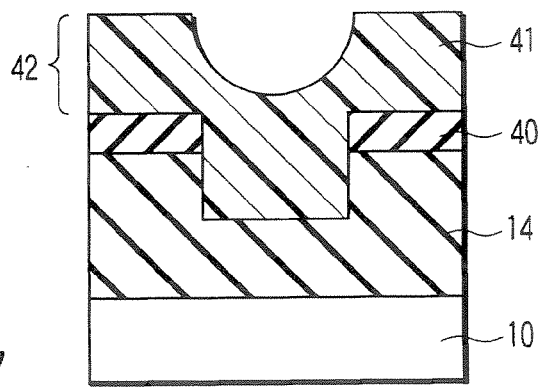
FIG. 7 shows a cross-sectional view illustrating a step in the manufacturing method of a semiconductor device according to another embodiment of the present invention.

First of all, as shown in FIG. 7, a first insulating film 14 made of LKD (available from JSR) and a second insulating film 40 made of black diamond (available from Applied Material Co., Ltd.) were successively deposited on a semiconductor substrate 10, and then a trench was formed with a width of 2 μm and a depth of 0.2 μm. Then, a resist film 41 was deposited all over the surface. As a result, due to the trench, a step portion 42 generated on the surface of the resist film 41. Herein, IX370G was employed as a resist.

Figure 8:
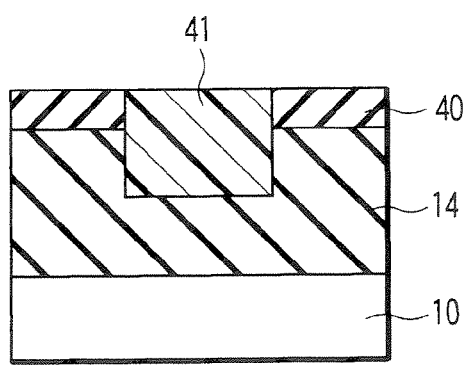
FIG. 8 shows a cross-sectional view illustrating a step next to the step shown in FIG. 7.

Then, a redundant portion of the resist film 41 was removed by CMP to leave the resist in the trench and expose the surface of the second insulating film 40 as shown in FIG. 8. The aqueous dispersion for CMP employed as a slurry was prepared by dispersing the polystyrene particles shown in the following Table 7 in pure water. These polystyrene particles were all provided, on their surfaces thereof, with carboxyl group and sulfonyl group. The content of the polystyrene particles in the aqueous dispersion for CMP was set to 1.0 wt %. The curvature radius and maximum length of these polystyrene particles are summarized in the following Table 7. Using the primary particle of polystyrene (glass transition temperature: 100° C.) having a curvature radius of 100 nm, the primary particle was associated to obtain associated resin particles having optional (maximum length/curvature radius) ratios. All of the aqueous dispersions were adjusted to have a pH of 4.

TABLE 7

| No. | Curvature radius (nm) | Max. length (nm) | (Max. length/ curvature radius) ratio |
|---|---|---|---|
| 26 | 100 | 200 | 2 |
| 27 |  | 250 | 2.5 |
| 28 |  | 500 | 5 |
| 29 |  | 1500 | 15 |
| 30 |  | 2500 | 25 |
| 31 |  | 3000 | 30 |

The CMP was performed as follows. Namely, as shown in FIG. 5, while allowing a turntable 20 having a polishing pad 21 (IC1000; RODEL Co., Ltd.) attached thereon to rotate at a speed of 75 rpm, a top ring 23 holding a semiconductor substrate 22 was contacted with the polishing pad 21 at a polishing load of 100 g/cm$^2$. The rotational speed of the top ring 23 was set to 75 rpm and a slurry 27 was fed from a slurry feed nozzle 25 to the surface of the polishing pad 21 at a flow rate of 200 cc/min. The polishing of the resist film 41 was continued until the top surface of the second insulating film 40 was entirely exposed, thus finishing the polishing.

Then, the polishing rate of the resist film, the dishing of resist and the peeling of film were investigated. When the polishing rate of the resist film was 200 nm/min or more, it was determined as good or "○", and when the polishing rate of the resist film was less than 200 nm/min, it was determined as bad or "X". For the purpose of determining the dishing of resist film, the polishing was continued to exceed well over the CMP time which enables the black diamond to expose as a result of the removal of the resist film, thus performing a +50% over-polishing. After finishing the CMP, the step portion on the surface was observed by AFM to measure the step portion to assess the dishing. When the dishing was 20 nm or less in the wiring trench having a width of 2 μm, the dishing was determined as good or "○", and when the dishing was more than 20 nm, it was determined as bad or "X". The peeling of film was determined by visually observing the entire surface of the semiconductor substrate and assessed as follows. When even the peeling was admitted only one portion thereof, it was determined as bad or "X", and when the peeling was not admitted at all, it was determined as good or "○". The results obtained are summarized in the following Table 8.

TABLE 8

| No. | Polishing rate | Dishing | Peeling of film |
|---|---|---|---|
| 26 | X | ○ | ○ |
| 27 | ○ | ○ | ○ |
| 28 | ○ | ○ | ○ |
| 29 | ○ | ○ | ○ |
| 30 | ○ | ○ | ○ |
| 31 | X | X | ○ |

As shown in Table 8, when the (maximum length/curvature radius) ratio is confined within the range of 2.5 to 25, it is possible to meet all of the conditions including the polishing rate of the resist film, the dishing of resist film and the peeling of film. The reason for this may be attributed to the fact that these associated resin particles were brought into a fixed state on the surface of polishing pad as explained above.

On the other hand, when an aqueous dispersion which is not associated and the (maximum length/curvature radius) ratio is less than 2.5, it is impossible to realize a practical polishing rate of the resist film as demonstrated in the aqueous dispersion of No. 26. When the (maximum length/curvature radius) ratio is higher than 25 also as in the case of the aqueous dispersion of No. 31, it is impossible to realize a practical polishing rate and to suppress the dishing of the resist film.

It was only possible, through the employment of the aqueous dispersion for CMP according to the embodiment of the present invention, to bury the resist film 41 in the trench while making it possible to suppress the generation of dishing and the peeling of film.

Figure 9:
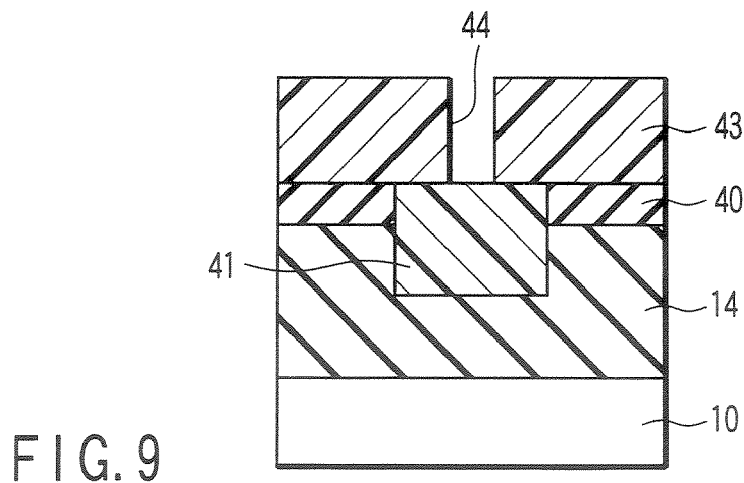
FIG. 9 shows a cross-sectional view illustrating a step next to the step shown in FIG. 8.

Thereafter, as shown in FIG. 9, a resist film 43 for exposure was coated all over the surface and then subjected to the processes of exposure and development to form a pattern of fine hole 44 having a diameter of 0.1 μm. The pattern of fine hole 44 of this kind could not be formed in a situation where the surface of the resist film 43 for exposure is not planar due to the step portion in the resist film 41.

Figure 10:
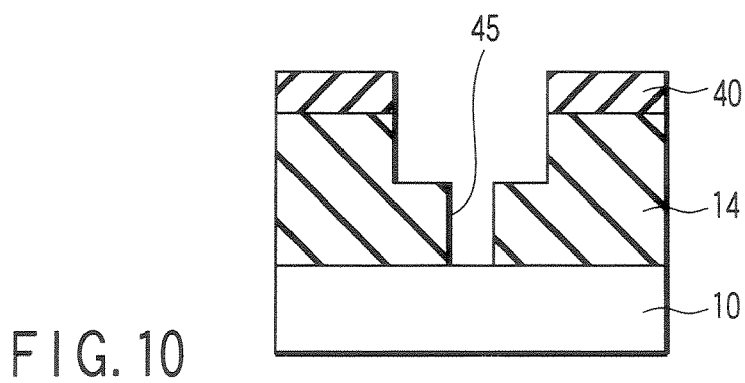
FIG. 10 shows a cross-sectional view illustrating a step next to the step shown in FIG. 9.
Figure 11:
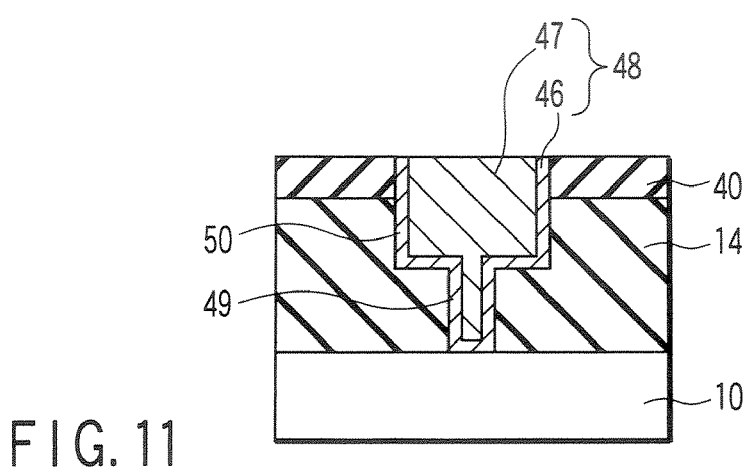
FIG. 11 shows a cross-sectional view illustrating a step next to the step shown in FIG. 10.

Using the pattern thus obtained as a mask, the resist film 41 in the trench and the first insulating film 14 were worked by RIE using $O_2$ and $C_4F_8$-based gas, thereby forming a via-hole as shown in FIG. 10. Incidentally, the resist film 43 for exposure and the resist film 41 in the trench were removed by $O_2$-RIE. Then, a barrier film 46 and a wiring material film 47 were successively deposited to form a conductive layer 48. In this case, Ta and Cu were employed for the formation of the barrier film 46 and the wiring material film 47, respectively. A redundant portion of the conductive material deposited on the second insulating film 40 was removed by CMP, thus leaving the conductive material in the trench and in the via-hole, thus obtaining a dual damascene structure comprising a wiring 50 and plug 49 as shown in FIG. 11.

As described above, the aqueous dispersion for CMP according to the embodiment of the present invention can be suitably applied to the CMP of a metal film and of a resist film. Further, the process using the aqueous dispersion for CMP according to the embodiment of the present invention can be suitably applied to the formation of shallow trench isolation (STI).

According to one embodiment of the present invention, it is possible to provide an aqueous dispersion for CMP which is capable of polishing a treating film with a sufficient abrasive force and without bringing about the peeling of film and the generation of dishing. According to another embodiment of the present invention, it is possible to provide a method of polishing a treating film with a sufficient abrasive force and without generating defectives in the treating film. According to a further embodiment of the present invention, it is possible to provide a method of manufacturing a semiconductor device which is equipped with a damascene wiring and has excellent reliabilities.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing method comprising:
   contacting a semiconductor substrate having a treating film with a polishing pad attached to a turntable, wherein the treating film is an organic film; and
   feeding an aqueous dispersion for a chemical mechanical polishing (CMP) to the polishing pad to polish a surface of the treating film, wherein the aqueous dispersion for the CMP comprises water and a resin particle, wherein the resin particle is accompanied with a projection having a curvature radius ranging from 10 nm to 1.65 μm on a surface of the resin particle, and a maximum length of the resin particle is not more than 5 μm and is 2.5 to 25 times larger than the curvature radius.

2. The method according to claim 1, wherein the resin particle is contained in the aqueous dispersion for the CMP at a content ranging from 0.05 to 5% based on a total weight of the dispersion.

3. The method according to claim 1, wherein the resin particle is formed from at least one polymer selected from the group consisting of polymethyl methacrylate, polystyrene, polyethylene, polyethylene glycol, polyvinyl acetate, polybutadiene, polyisobutylene, polypropylene and polyoxymethylene.

4. The method according to claim 1, wherein the treating film is a resist film.

5. A method for manufacturing a semiconductor device comprising:
   forming an insulating film on a semiconductor substrate;
   forming a recess in the insulating film;
   depositing an organic material in the recess on the insulating film to form an organic film; and
   removing at least a part of the organic film deposited on the insulating film by an aqueous dispersion for the CMP, thereby leaving the organic film in the recess, wherein the aqueous dispersion for the CMP comprises water and a resin particle; wherein the resin particle is accompanied with a projection having a curvature radius ranging from 10 nm to 1.65 μm on a surface of the resin particle, and a maximum length of the resin particle is not more than 5 μm and is 2.5 to 25 times larger than the curvature radius.

6. The method according to claim 5, wherein the recess is a wiring trench having a region with a width of 2 μm and a depth of 0.2 μm.

7. The method according to claim 6, wherein the organic film comprises a resist.

8. The method according to claim 7, wherein the removing of the organic material is performed until the insulating film is exposed.

9. The method according to claim 8, wherein the removing of the organic material is performed at a loading ranging from 30 to 100 gf/cm$^2$.

10. The method according to claim 1, wherein the resin particle has a functional group on the surface.

11. The method according to claim 10, wherein the functional group is selected from the group consisting of carboxyl group, amino group, and sulfonyl group.

12. The method according to claim 1, wherein the aqueous dispersion further comprises a surfactant.

13. The method according to claim 12, wherein the surfactant is at least one selected from the group consisting of aliphatic soap, sulfate ester, phosphate ester, aliphatic amine salt, aliphatic ammonium salt, acetylene glycol, ethylene oxide adduct thereof, acetylene alcohol, silicone-based surfactants, polyvinyl alcohol, cyclodextrin, polyvinyl methylether, and hydroxyethyl cellulose.

14. The method according to claim 12, wherein the surfactant is contained in the aqueous dispersion for the CMP at a content ranging from 0.001 to 0.5% based on a total weight of the dispersion.

15. The method according to claim 5, wherein the resin particle is contained in the aqueous dispersion for the CMP at a content ranging from 0.05 to 5% based on a total weight of the dispersion.

16. The method according to claim 5, wherein the resin particle is formed of at least one polymer selected from the group consisting of polymethyl methacrylate, polystyrene, polyethylene, polyethylene glycol, polyvinyl acetate, polybutadiene, polyisobutylene, polypropylene, and polyoxymethylene.

17. The method according to claim 5, wherein the resin particle has a functional group on the surface.

18. The method according to claim 7, further comprising:
forming a resist film for exposure on the insulating film, wherein the resist film has a pattern of a fine hole;
forming a via-hole in the insulating film using the pattern as a mask;
removing the resist film for exposure and the resist film in the wiring trench;
depositing a barrier film and a wiring film successively to form a conductive layer formed of a conductive material; and
removing a redundant portion of the conductive material deposited on the insulating film, thus leaving the conductive material in the wiring trench and in the via-hole to obtain a dual damascene structure.

19. The method according to claim 18, wherein the barrier film is formed of Ta.

20. The method according to claim 18, wherein the wiring material film is formed of Cu.

* * * * *